(12) United States Patent
Jomaa

(10) Patent No.: US 8,067,266 B2
(45) Date of Patent: Nov. 29, 2011

(54) METHODS FOR THE FABRICATION OF MICROELECTRONIC DEVICE SUBSTRATES BY ATTACHING TWO CORES TOGETHER DURING FABRICATION

(75) Inventor: Houssam Jomaa, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/655,089

(22) Filed: Dec. 23, 2009

(65) Prior Publication Data

US 2011/0147439 A1    Jun. 23, 2011

(51) Int. Cl.
*H01L 21/00* (2006.01)
(52) U.S. Cl. .............. 438/106; 257/734; 257/E21.505; 361/748; 174/262
(58) Field of Classification Search .......... None
See application file for complete search history.

(56) References Cited

U.S. PATENT DOCUMENTS

| | | | |
|---|---|---|---|
| 6,580,036 B2 * | 6/2003 | Kim et al. | 174/261 |
| 6,696,764 B2 * | 2/2004 | Honda | 257/778 |
| 6,988,312 B2 * | 1/2006 | Nakamura et al. | 29/830 |
| 7,093,356 B2 * | 8/2006 | Imafuji et al. | 29/847 |
| 7,346,982 B2 * | 3/2008 | Kim et al. | 29/847 |
| 7,543,374 B2 * | 6/2009 | Nakamura | 29/846 |
| 7,736,457 B2 * | 6/2010 | Iwata | 156/247 |
| 7,737,366 B2 * | 6/2010 | Shirai et al. | 174/262 |
| 7,841,076 B2 * | 11/2010 | Fujii | 29/832 |
| 2004/0198033 A1 * | 10/2004 | Lee et al. | 438/613 |
| 2004/0211751 A1 * | 10/2004 | Shuto et al. | 216/13 |
| 2009/0250259 A1 * | 10/2009 | Mok et al. | 174/263 |

* cited by examiner

*Primary Examiner* — Evan Pert
*Assistant Examiner* — Andres Munoz
(74) *Attorney, Agent, or Firm* — Winkle, PLLC

(57) ABSTRACT

The present disclosure relates to fabricating substrates for use in microelectronic device packages. In at least one embodiment, two substrate cores may be attached together during build-up layer formation on each substrate core to increase substrate fabrication throughput. The embodiments of the present disclosure may allow the processing of relatively thin substrates.

18 Claims, 10 Drawing Sheets

METHODS FOR THE FABRICATION OF MICROELECTRONIC DEVICE SUBSTRATES BY ATTACHING TWO CORES TOGETHER DURING FABRICATION

BACKGROUND OF THE INVENTION

In the production of microelectronic devices, microelectronic dice are generally mounted on substrates which provide electrical communication routes between the microelectronic dice and external components. The substrate may add considerably to the overall expense of a microelectronic package. Thus, in the pursuit of lower costs, advancements that reduce the cost of substrates are continually sought by the microelectronic device industry.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
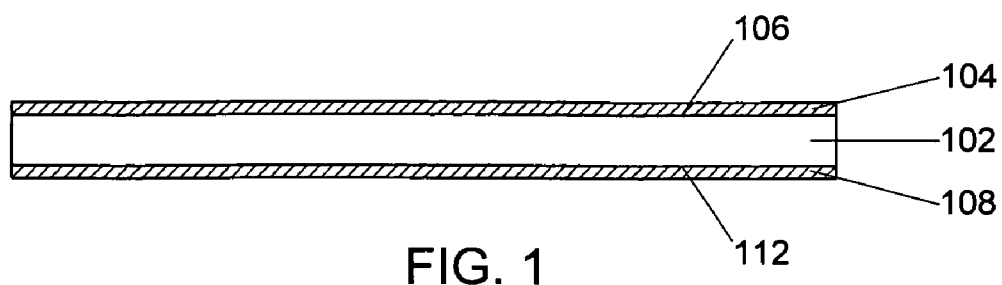
FIGS. 1-20 illustrate side cross-sectional views of a process of fabricating microelectronic substrate cores.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating substrate for use in microelectronic device packages. In at least one embodiment, an attachment device may be used to attach two cores together during build-up layer formation to increase substrate fabrication throughput. The embodiments of the present disclosure may allow the processing of thinner substrates without requiring significant investment in current manufacturing technologies.

In the production of microelectronic devices, microelectronic dice are typically mounted on substrates for packaging purposes. A substrate typically comprises a core having multiple layers of dielectric material, conductive traces, and vias through the dielectric material on a first surface thereof to form a trace network to which the microelectronic die is electrically connected, and multiple layers of dielectric material, conductive traces, and vias through the dielectric material on a second surface thereof to form a trace network on which interconnects, such as solder balls or pins are formed for electrical communication with external components. To achieve electrical interconnect between the first surface trace network and the second surface trace network, holes are formed through the substrate core in specific locations and these holes are plated with a conductive material.

As shown in FIG. 1, the fabrication of a substrate may begin with providing a core 102 having a first conductive material layer 104 formed on a first surface 106 of the core 102 and a second conductive material layer 108 formed on a second surface 112 of the core 102. The core 102 may be any appropriate material, including, but not limited to, bismaleimine triazine resin, fire retardant grade 4 material, polyimide materials, glass reinforced epoxy matrix material, and the like, as well as laminates or multiple layers thereof. The first conductive material layer 104 and the second conductive material layer 108 may be any conductive material, including, but not limited to metals, such as copper, silver, and aluminum, and alloys thereof. In one embodiment, the core 102 has the thickness 114 of less than about 400 μm. In another embodiment, the core has a thickness 114 of less than about 200 μm.

Figure 2:
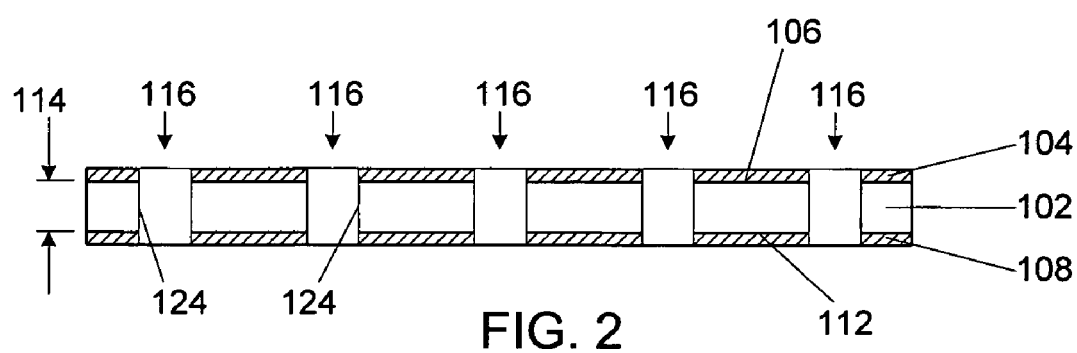

As shown in FIG. 2, at least one via 116 is formed through the first conductive material layer 104, the second conductive material layer 108, and the core 102. For the purposes of illustration, the figures show a plurality of vias 116. In one embodiment, the vias 116 are substantially perpendicular to the core first surface 106 and the core second surface 112. The vias 116 may be formed by any known technique including but not limited to laser ablation, ion ablation, and mechanical drilling.

Figure 3:
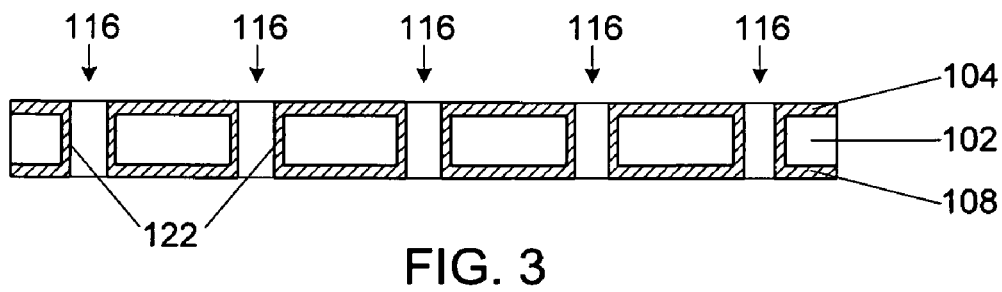

As shown in FIG. 3, the structure of FIG. 2 may be plated to form a conductive material layer 122 on the exposed surfaces 124 (see FIG. 2) of the core 102 within each via 116. The plating may be achieved through electroless and electrolytic plating. In one embodiment, the conductive layer 122 material may be copper or alloys thereof.

Figure 4:
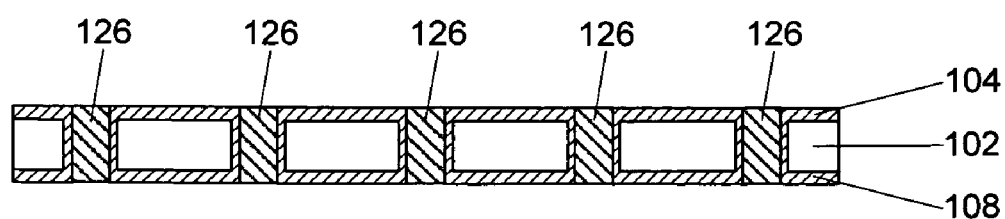

As shown in FIG. 4, the vias 116 may be filled to form a plug 126 therein. The plug 126 may be made of any appropriate electrically conductive or non-conductive material. In one embodiment, the material used to form the plug may be an epoxy material which is selected to have a coefficient of thermal expansion that is similar to that of the core 102. It is, of course, understood that the plug 126 may undergo a planarization step (such as grind), as well as a curing step when polymeric materials are used. Further, it is understood, that a second plating step may be performed to cap the ends of the plugs 126 (not shown).

Figure 5:
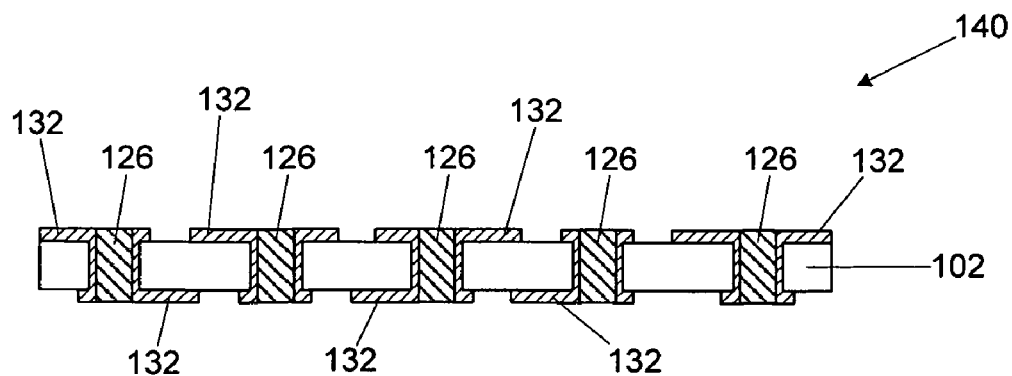

As shown in FIG. 5, the first conductive material layer 104 and the second conductive material layer 108 may be patterned to form first traces 132 to route a path of electronic conduction, as will be understood to those skilled in the art, to form a first intermediate substrate 140. The first conductive material layer 104 and the second conductive material layer 108 may be patterned by any known technique in art including lithography, wherein a photoresist material is patterned on the first conductive layer and the second conductive layer and portions thereof are etched away using the photoresist material as a shield to the etching.

Figure 6:
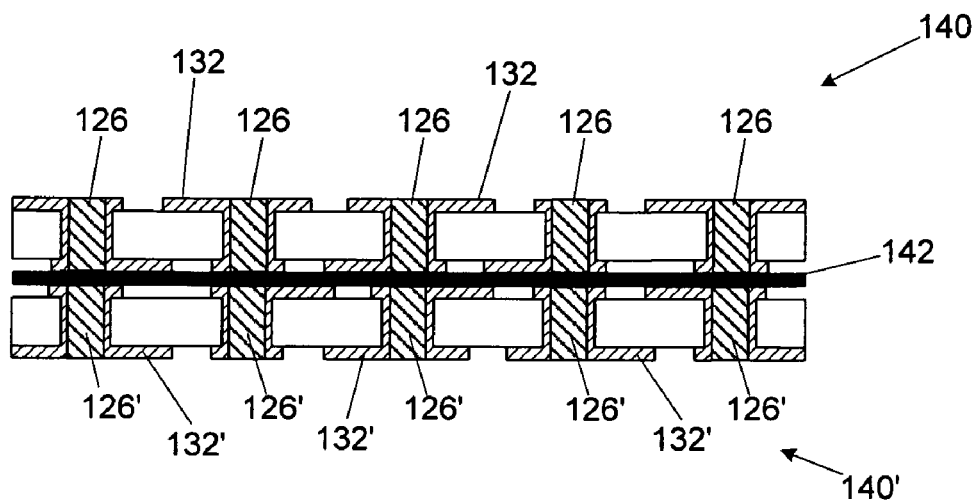

As shown in FIG. 6, a second intermediate substrate 140' is provided. In the illustrated embodiment, the second intermediate substrate 140' is substantially similar to the first intermediate substrate 140 of FIG. 5. As the structure and composition of the first intermediate substrate 140 and the second intermediate substrate 140' are substantially similar, corresponding components between the first intermediate substrate 140 and the second intermediate substrate 140' are similarly numbered and differentiated by an apostrophe ('). It is, of course, understood that the first intermediate substrate 140 and the second intermediate substrate 140' need not be substantially similar, but may be different designs entirely which require similar processing steps. Thus, two separate products could be made in a single processing cycle.

The second intermediate substrate 140' may be positioned with its core first surface 106' to face the core first surface 106 of the first intermediate substrate 140 and coupled thereto with an attachment device.

In one embodiment, as shown in FIG. 6, the attachment device may be an adhesive device 142. The second intermediate substrate 140' may be positioned with its core first surface 106' to face the core first surface 106 of the first intermediate substrate 140 with an adhesive device 142 placed between the first intermediate structure 140 and the second intermediate structure 140' to attach the first intermediate substrate 140 to the second intermediate structure 140'. The adhesive device 142 may be an adhesive material, an adhesive sheet, a substrate with the adhesive material on opposing surfaces and the like.

Figure 7:
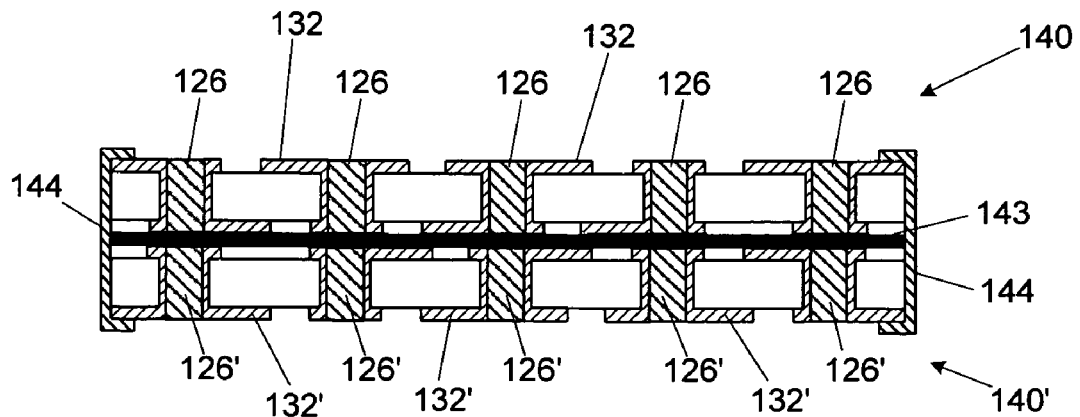

In another embodiment, as shown in FIG. 7, the attachment device may be a clamping device 144. The second intermediate substrate 140' is positioned with its core first surface to face the core first surface with a protective material 143 placed between the first intermediate structure 140 and the second intermediate structure 140', and one or more clamping devices 144 may then be placed to maintain this position.

The clamping device 144 is shown in a generic form in FIG. 6 as the clamping device 144 is not limited to any specific form or structure. The clamping device 144 may be any mechanism which can used to maintain the position of the first intermediate structure 140 and the second intermediate structure 140' and may include, but is not limited to, a spring clip or a screw clamp. In one embodiment, the clamping device 144 may be a single clamp that surrounds a periphery of the first intermediate structure 140 and the second intermediate structure 140'. In another embodiment, the clamping device 144 may be a plurality of clamps positioned appropriately about the periphery of the first intermediate structure 140 and the second intermediate structure 140'.

The protective material 143 may be any material that prevents the first intermediate structure 140 and the second intermediate structure 140' from damaging one another when clamped. The protective material 143 may be, but is not limited to an open or closed cell foam, or an elastomer mat or sheet, such as polyisoprene sheet (synthetic or natural rubber), a polybutadiene sheet, a polyisobutylene sheet, or a polyurethane sheet.

In the figures which follow, the embodiment where the first intermediate substrate 140 is attached to the second intermediate structure 140' with an adhesive device 142 will be illustrated.

Figure 8:
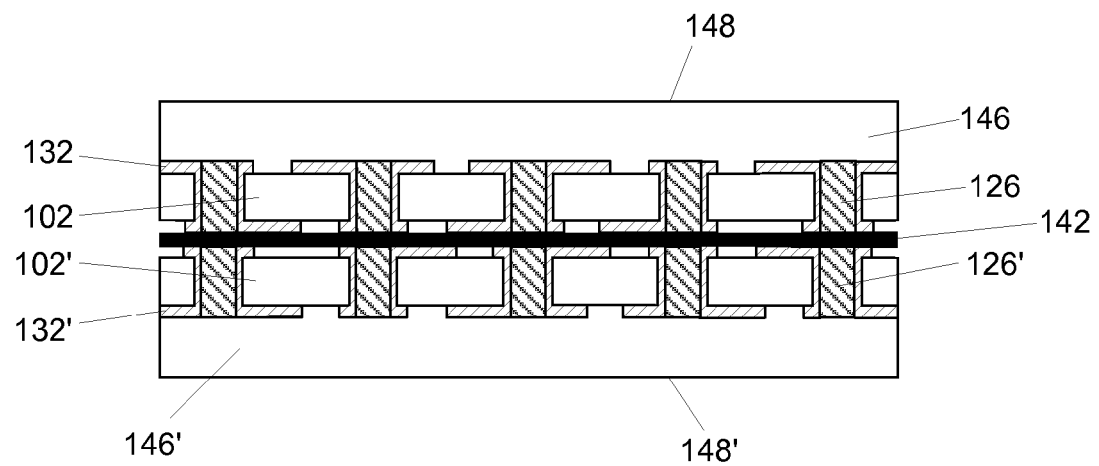

As shown in FIG. 8, a first dielectric layer 146 and a first opposing dielectric layer 146' may be substantially simultaneously formed on the first intermediate structure 140 and the second intermediate structure 140', respectively. In one embodiment, the first dielectric layer 146 and the first opposing dielectric layer 146' may be formed by abutting a dielectric build-up layer sheet, such as a silica filled epoxy materials, against the first intermediate structure 140 and abutting a dielectric build-up layer sheet against the second intermediate structure 140', which is laminated by a vacuum lamination process. It is understood that numerous processing technique could also be employed, such as a hot press technique, as known in the art. In another embodiment, the first dielectric layer 146 and the first opposing dielectric layer 146' may be formed by deposition a dielectric film, such as a polyimide material, by chemical vapor deposition.

Figure 9:
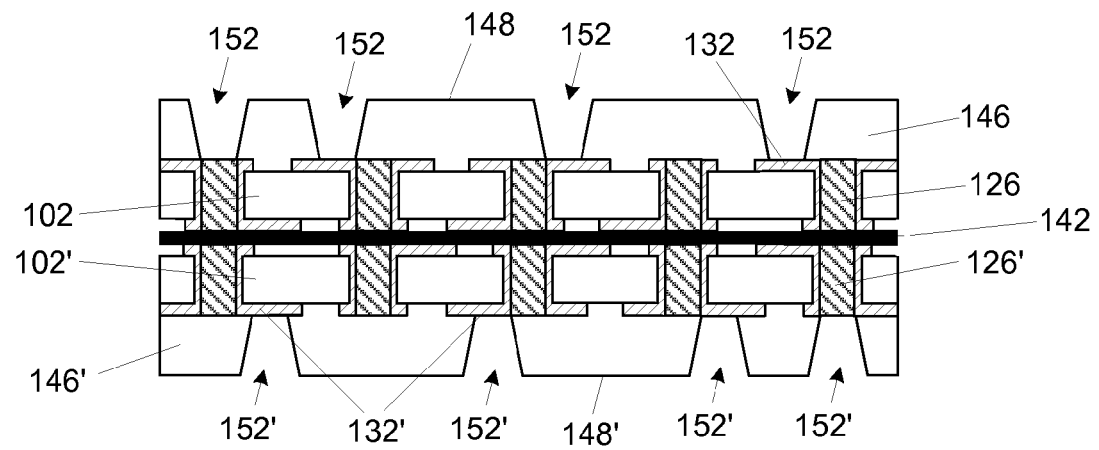

As shown in FIG. 9, microvias 152, 152' may be formed through the first dielectric layer 146 and the first opposing dielectric layer 146' to expose appropriate first traces 132, 132', respectively. The microvias 152, 152' may be substantially simultaneously formed by any technique known in the art. In one embodiment, the microvias 152, 152' are formed by laser drilling with a $CO_2$ laser.

Figure 10:
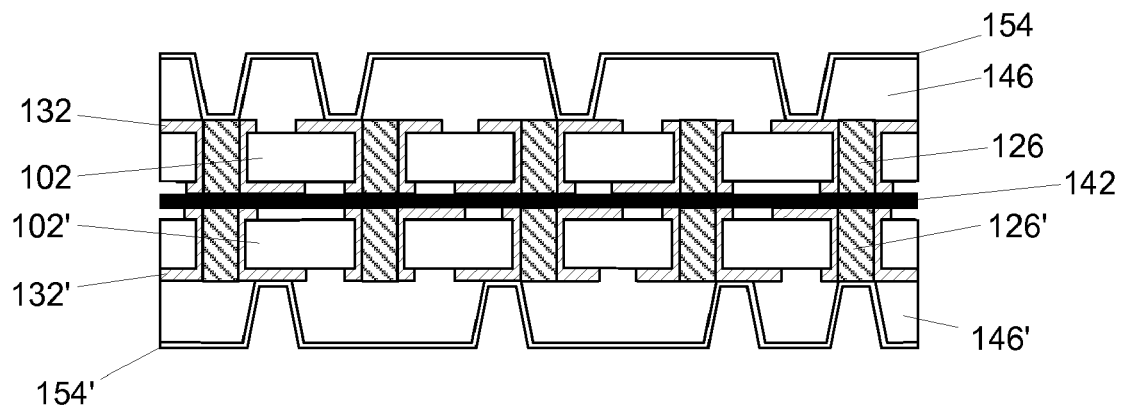

As shown in FIG. 10, a first metal seed layers 154, 154' may be substantially simultaneously formed on the dielectric layer exposed surfaces 148, 148' and in the microvias 152, 152', respectively. The first metal seed layers 154, 154' may be formed by any technique known in the art. In one embodiment, the metal seed layers 154, 154' are form by electroless plating. The first metal seed layers 154, 154' may be copper or alloys thereof and may be deposited at a thickness of less than 1 µm.

Figure 11:
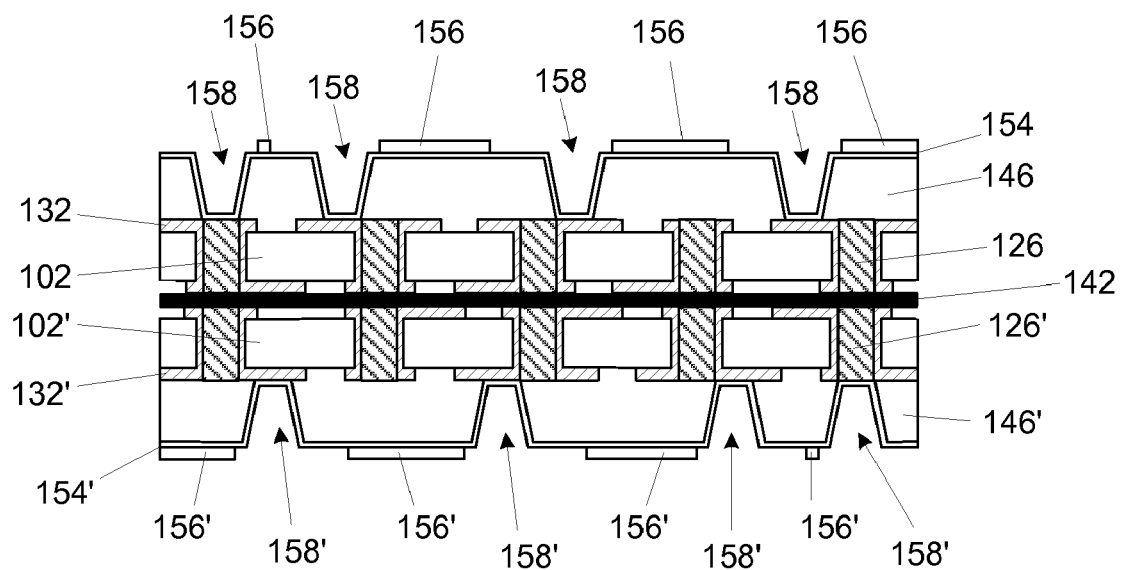

As shown in FIG. 11, plating guides 156, 156' may be substantially simultaneously formed on the first metal seed layers 154, 154' which leaves exposed areas 158, 158' to be plated. The patterning can be achieved by any means in the art, including but not limited to lithography.

Figure 12:
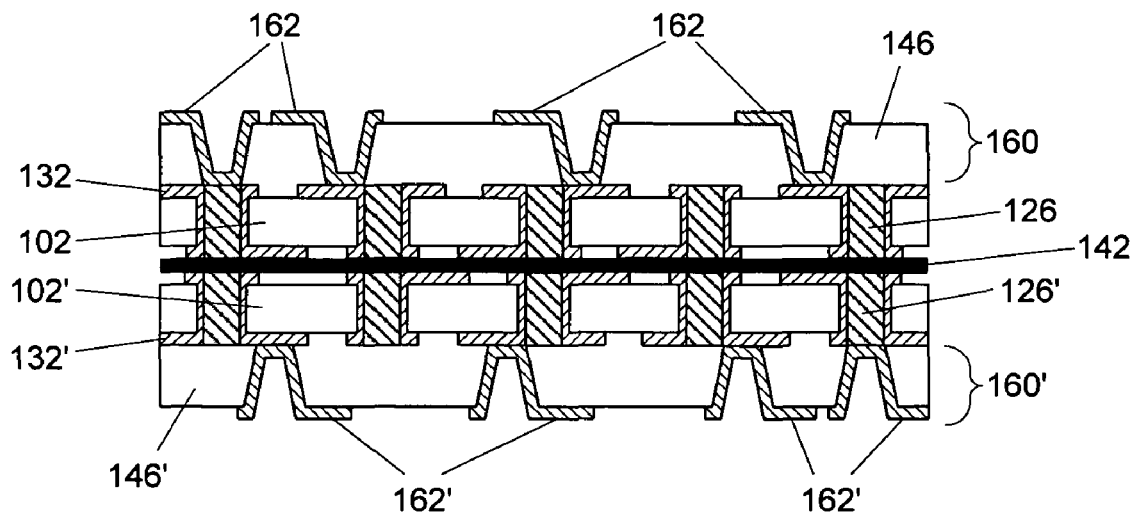

As shown in FIG. 12, the exposed areas 158, 158' (see FIG. 11) may be substantially simultaneously plated to form second traces 162, 162' and the plating guides 156, 156' and portions of the first metal seed layers 154, 154' not plated are removed.

The process illustrated in FIG. 8 though FIG. 12 may be repeated any appropriate number of times to achieved a desired routing, as will be understood to those skilled in the art. The process illustrated in FIG. 8 though FIG. 12 with regard to forming a dielectric layer and conductive traces on a substrate is referred to a forming a build-up layer 160, 160', respectively.

Figure 13:
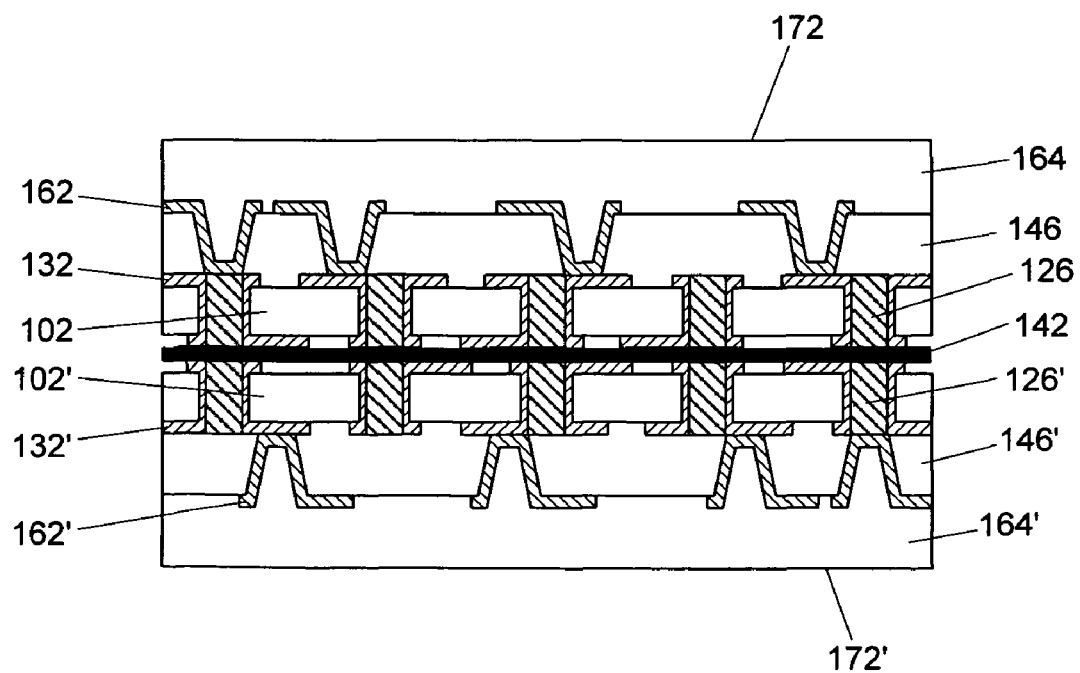

As shown in FIG. 13, a second dielectric layer 164 and a second opposing dielectric layer 164' may be formed substantially simultaneously on the second traces 162, 162' and the exposed portions of the first dielectric layers 146, 146', respectively. The second dielectric layers 164, 164' may be formed in the same manner as the first dielectric layers 146, 146'.

Figure 14:
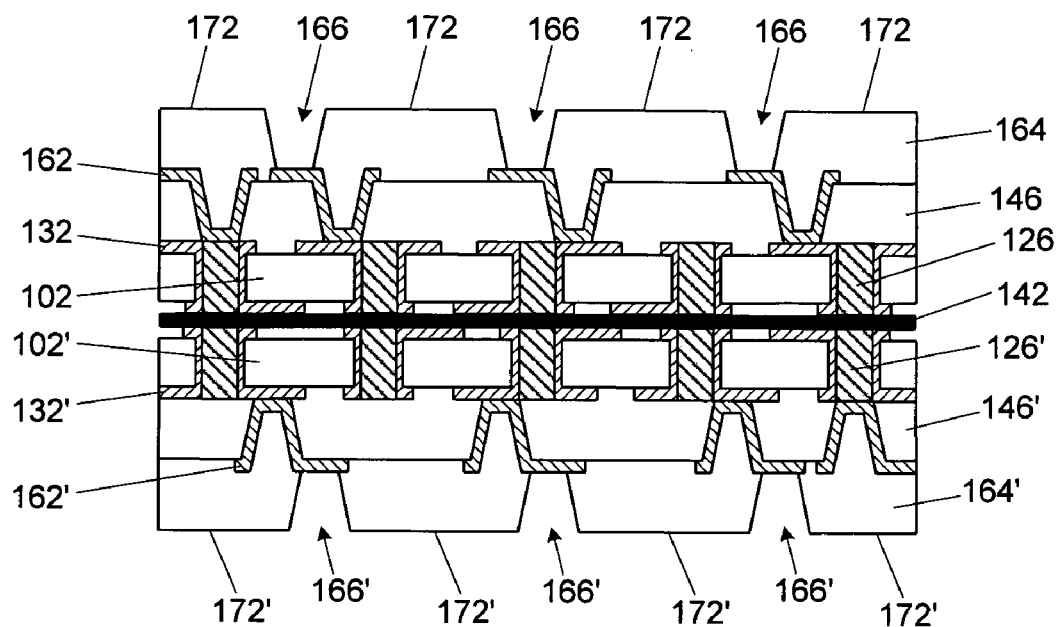

As shown in FIG. 14, microvias 166, 166' may be substantially simultaneously formed through the second dielectric layer 164 and the second opposing dielectric layer 164' to expose appropriate second traces 162, 162', respectively. The microvias 166, 166' may be formed by any technique known in the art. In one embodiment, the microvias 166, 166' are formed by laser drilling with a $CO_2$ laser.

Figure 15:
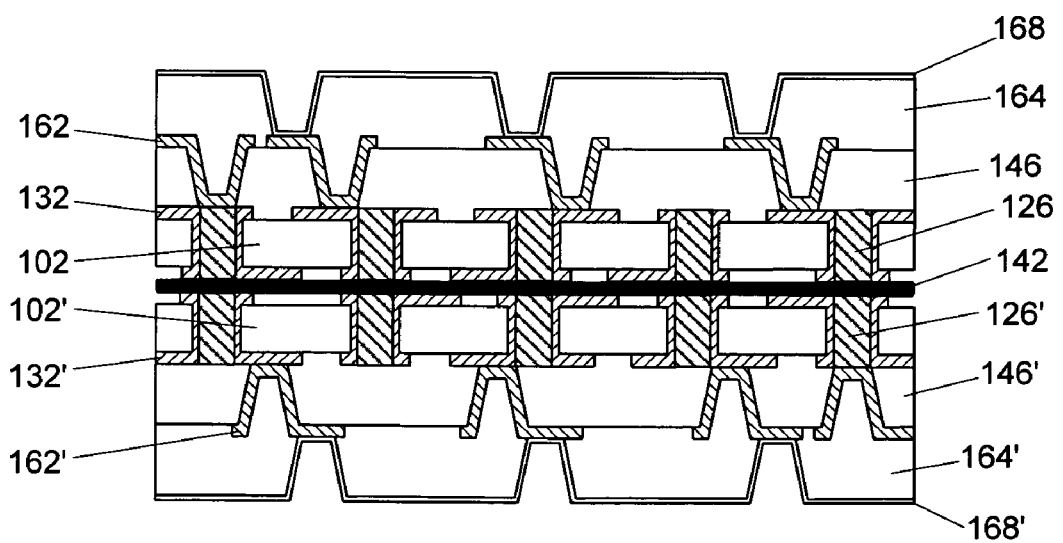

As shown in FIG. 15, a second metal seed layers 168, 168' may be substantially simultaneously formed on the second dielectric layer exposed surfaces 172, 172' (see FIG. 14) and in the microvias 166, 166' (see FIG. 14), respectively. The second metal seed layers 168, 168' may be formed by any technique known in the art. In one embodiment, the second metal seed layers 168, 168' are form by electroless plating. The second metal seed layers 168, 168' may be copper or alloys thereof and may be deposited at a thickness of less than 1 μm.

Figure 16:
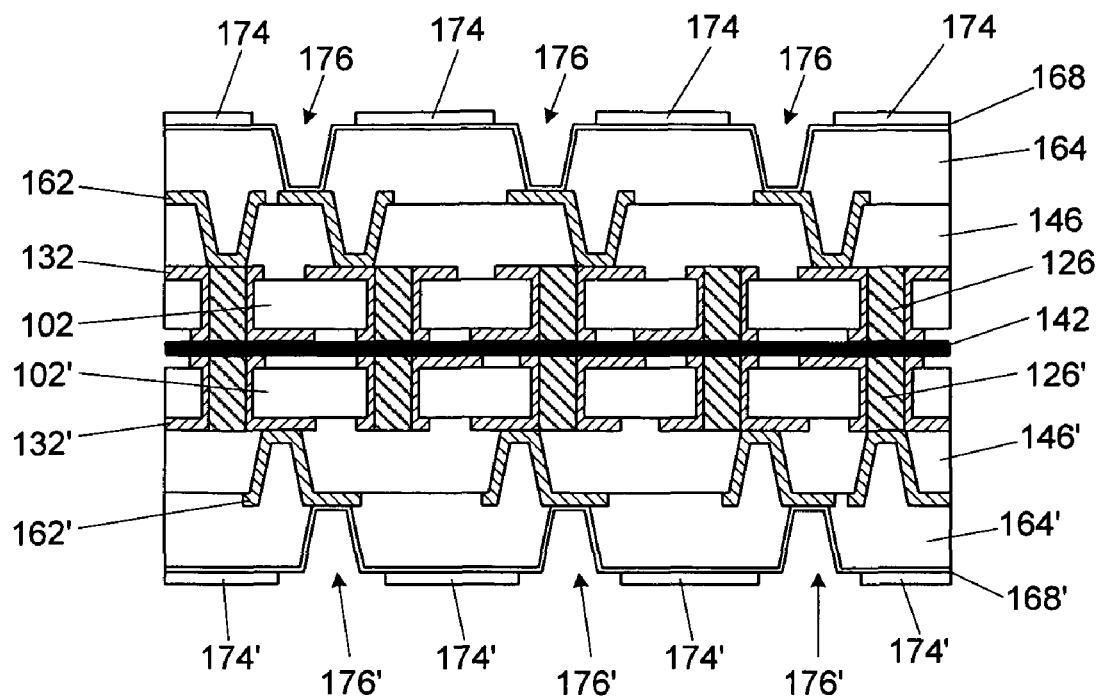

As shown in FIG. 16, plating guides 174, 174' may be substantially simultaneously formed on the second metal seed layers 168, 168' which leaves exposed areas 176, 176' to be plated. The patterning can be achieved by any means in the art, including but not limited to lithography.

Figure 17:
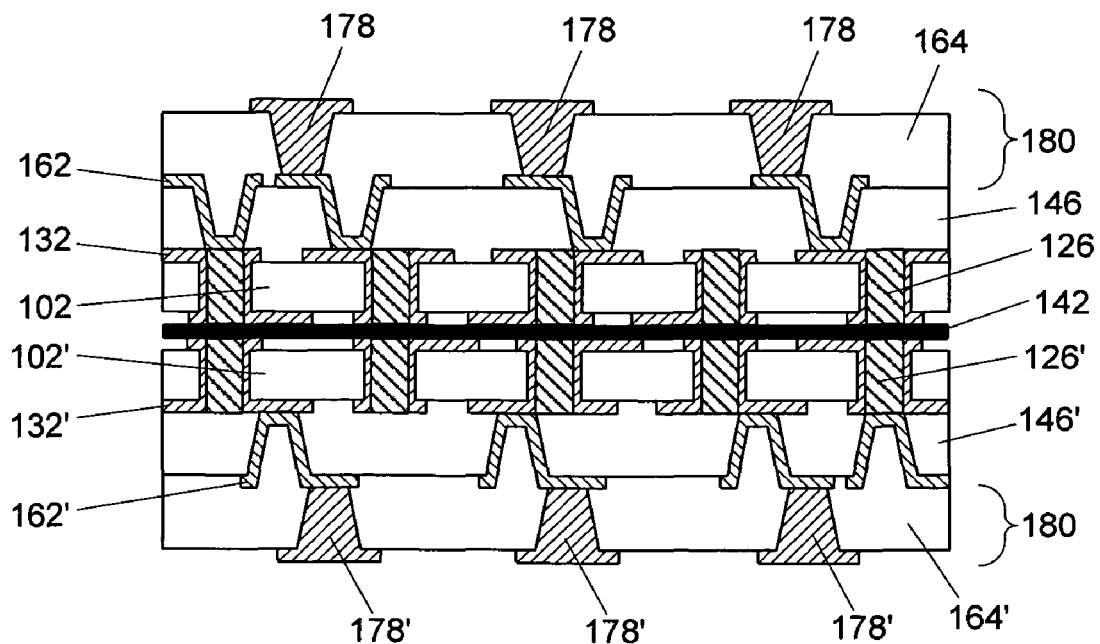

As shown in FIG. 17, the exposed areas 176, 176' (see FIG. 16) may be substantially simultaneously plated to substantially fill the microvias 166, 166' (see FIG. 15) form structures 178, 178' to serve as platforms for the fabrication of interconnects. The plating guides 174, 174' and portions of the second metal seed layer 168, 168' not plated are removed. Thus, forming second build-up layers 180, 180', respectively.

Figure 18:
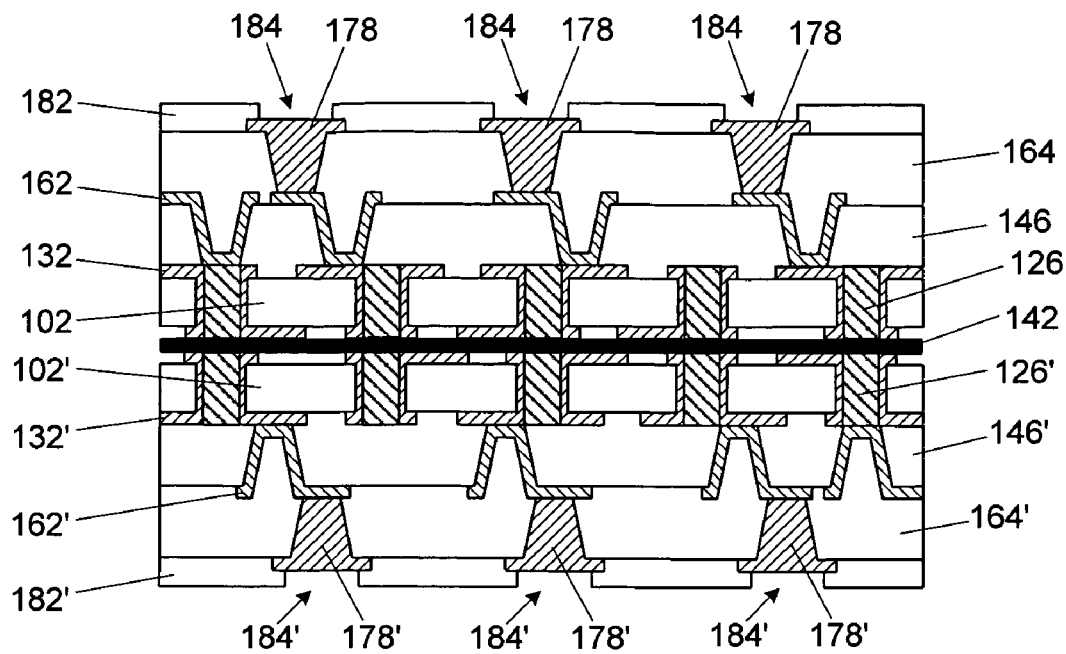

As shown in FIG. 18, solder resist layers 182, 182' may be substantially simultaneously patterned on the second dielectric layers 164, 164', such that openings 184, 184' expose the platform structures 178, 178', respectively. The solder resist layers 182, 182' may be pattern by any technique known in the art, including but not limited to roll coating, screen printing, or vacuum lamination. The solder resist layer 182, 182' may also be cured prior to further processing.

Figure 19:
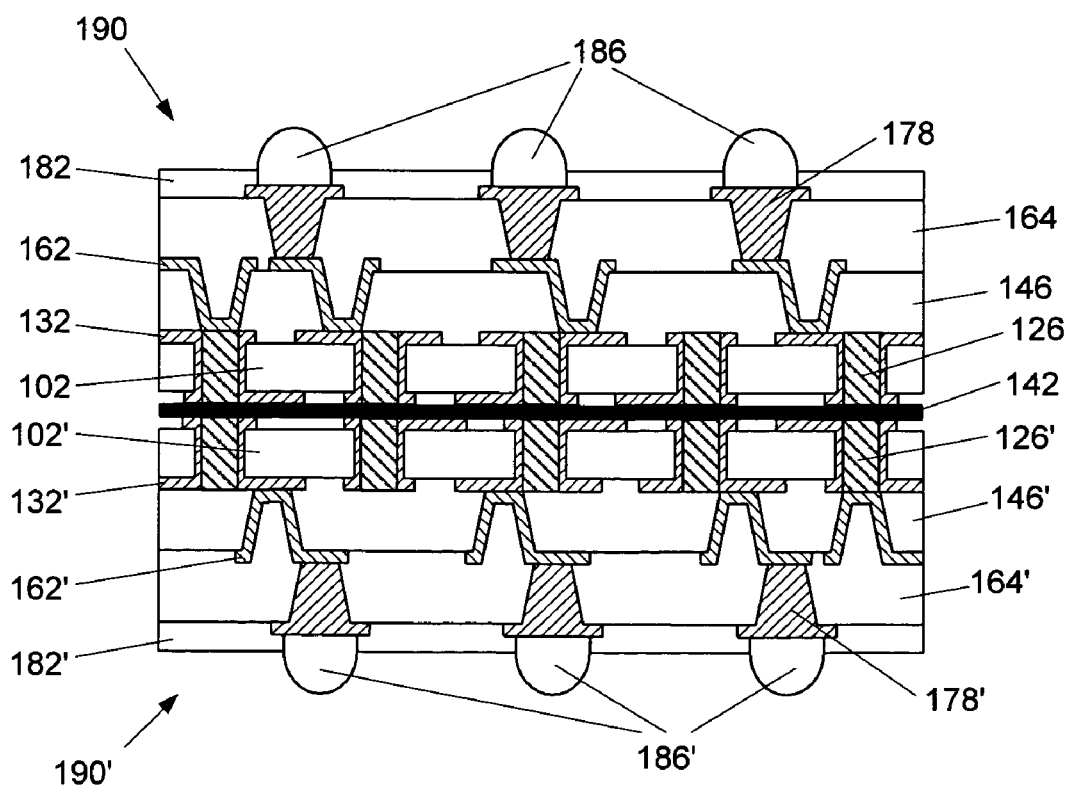

As shown in FIG. 19, a plurality of interconnects 186, 186' may be substantially simultaneously formed on the platform structures 178, 178'. Thereby, forming a first substrate 190 and a second substrate 190'.

In the illustrated embodiment, the interconnects are solder balls, which may be formed by depositing a solder paste, such as by stenciling, on the platform structures 178, 178' and reflowing the solder paste to form the solder balls. The solder balls may also be formed by direct ball placement on the platform structures 178, 178'. The solder balls may be lead alloy solders, such as a lead/tin alloys, or lead-free solders, such as tin/silver/bismuth and copper alloys. It is further understood that the platform structures 178, 178' may have various material layer formed thereon before the formation of the solder balls 188, 188' to promote adhesion.

Figure 20:
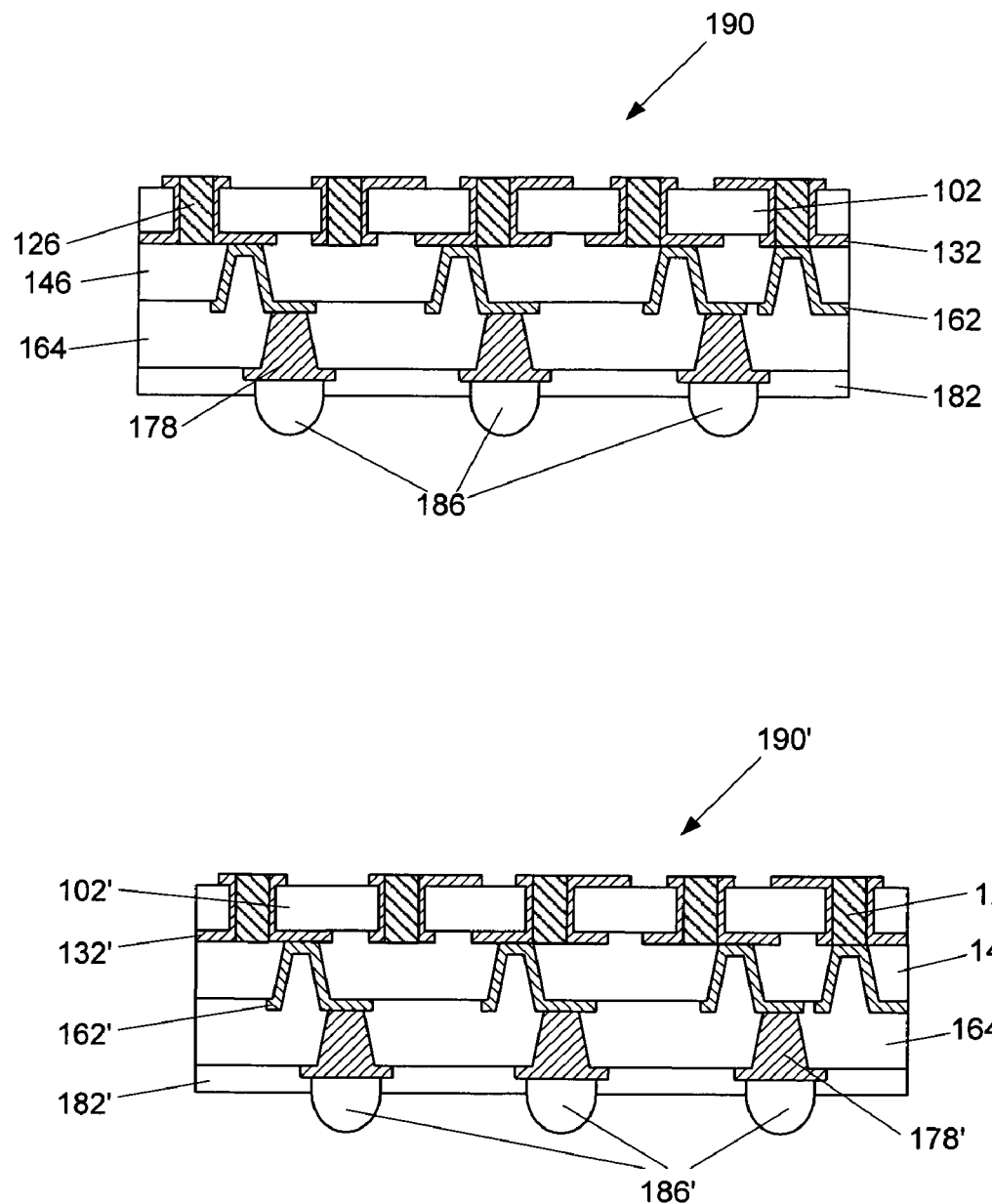

As shown in FIG. 20, the attachment device is removed to separate the first substrate 190 and the second substrate 190'. When the attachment device is an adhesive device 142, the substrates 190, 190' may simply be pulled apart and the adhesive device removed. When the attachment device is a clamping device 144, the clamping device 144 is simply removed. The substrates 190, 190' may be further processed with structures formed to facilitate that attachment of a microelectronic die (not shown)

Figure 21:
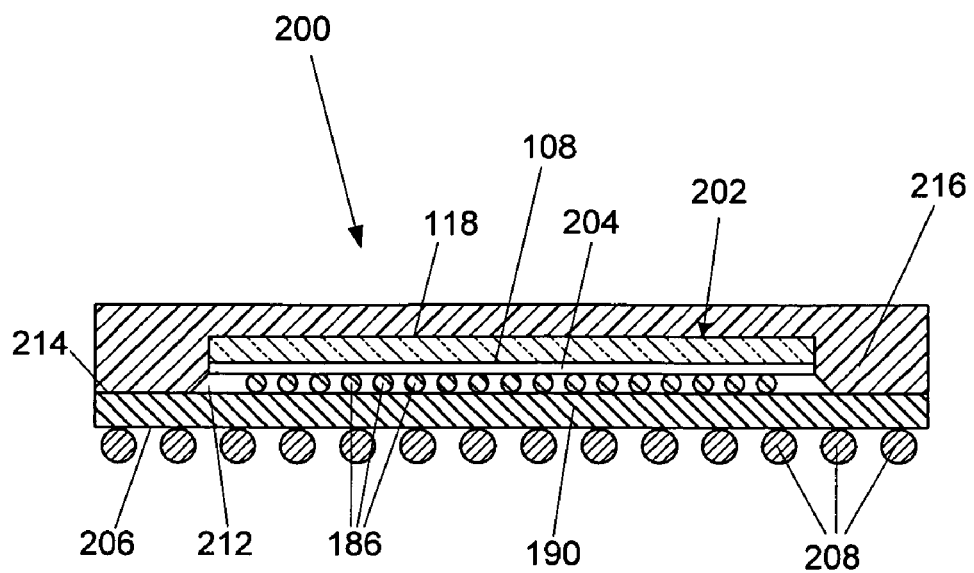
FIGS. 21 and 22 are a side cross-sectional view of a microelectronic device packages including one of the substrates fabricated as illustrated in FIGS. 1 through 20.

FIG. 21 illustrates a microelectronic device package 200. The microelectronic device package 200 may include a microelectronic die 202 (such as a microprocessor, a chipset, a memory device, an ASIC, and the like) attached by its interconnect surface 204 to a second surface 206 of the substrate 190 through the interconnects 186 (shown as solder balls) extending from bond pads (not shown) on the microelectronic die interconnect surface 204 to land pads (not shown) on the substrate second surface 206 to make electrical contact therebetween, as will be understood by those skilled in the art. An underfill material 212 is dispersed between the microelectronic die interconnect surface 204 and the substrate first surface 206. The underfill material 212 provides mechanical support, contamination protection, and improves package reliability. The substrate interconnects 208 (shown as solder balls) on a substrate first surface 206 are used to connect the package to an external component (not shown), as will be understood to those skilled in the art. The microelectronic die 202 and exposed substrate first surface 206 are encapsulated in a molding material 216 to prevent physical and chemical damage. It is understood that the substrate interconnects 208 may be pins (not shown) to form a pin grid array device.

Figure 22:
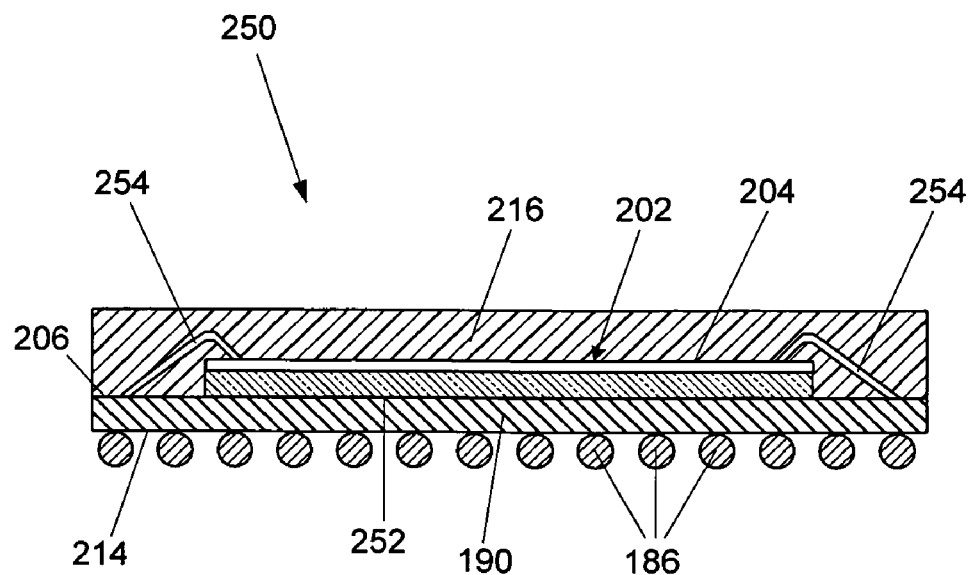

FIG. 22 illustrates an alternative microelectronic device package 250. The microelectronic device package 250 may include the microelectronic die 202 (such as a microprocessor, a chipset, a memory device, an ASIC, and the like) attached by a back surface 252 to a substrate first surface 206. A plurality of bond wires 254 extend from bond pads (not shown) on the microelectronic die interconnect surface 204 to land pads (not shown) on the substrate first surface 206 to make electrical contact therebetween, as will be understood by those skilled in the art. The substrate 190 also includes a plurality of interconnects 186 (shown as solder balls) on a substrate second surface 214. These interconnects 186 connect the package to an external component (no shown), as will be understood to those skilled in the art. The microelectronic die 202 and bond wires 254 are encapsulated in a molding material 214 to prevent physical and chemical damage.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of fabricating microelectronic device substrates, comprising:
    forming a first intermediate substrate including
        providing a first core having a first surface and an opposing second surface;
        forming at least one conductive trace on the first surface of the first core;
        forming at least one conductive trace on the second surface of the first core;
        forming at least one plated via extending between the at least one conductive trace on the first surface of the first core and the at least one conductive trace on the second surface of the first core; and
        filling the at least one plated via;
    forming a second intermediate substrate including
        providing a second core having a first surface and an opposing second surface;
        forming at least one conductive trace on the first surface of the second core;
        forming at least one conductive trace on the second surface of the second core;
        forming at least one plated via extending between the at least one conductive trace on the first surface of the second core and the at least one conductive trace on the second surface of the second core; and
        filling the at least one plated via;
    then attaching the first intermediate substrate to the second intermediate substrate wherein the first surface of the first intermediate substrate first core faces the first surface of the second intermediate substrate second core;
    substantially simultaneously forming at least one build-up layer adjacent the second surface of the first intermediate substrate first core and at least one build-up layer adjacent the second surface of the second intermediate substrate second core; and
    separating the first intermediate substrate from the second intermediate substrate.

2. The method of claim 1, wherein forming the first intermediate substrate including the first core and forming the second intermediate substrate including the second core comprises forming the first intermediate substrate including the first core having a thickness of less than about 400 µm and forming the second intermediate substrate including the second core having a thickness of less than about 400 µm.

3. The method of claim 1, wherein forming the first intermediate substrate including the first core and forming the second intermediate substrate including the second core comprises forming the first intermediate substrate including the first core having a thickness of less than about 200 µm and forming the second intermediate substrate including the second core having a thickness of less than about 200 µm.

4. The method of claim 1, wherein attaching the first intermediate substrate to the second intermediate substrate comprises disposing an adhesive device between the first intermediate substrate and the second intermediate substrate.

5. The method of claim 4, wherein disposing an adhesive device between the first intermediate substrate and the second intermediate substrate comprises disposing an adhesive material between the first intermediate substrate and the second intermediate substrate.

6. The method of claim 1, wherein attaching the first intermediate substrate to the second intermediate substrate comprises clamping the first intermediate substrate to the second intermediate substrate.

7. The method of claim 6, further comprises placing a protective material between the first intermediate substrate and the second intermediate substrate prior to clamping.

8. The method of claim 1, further comprises substantially simultaneously forming interconnects on the at least one first intermediate substrate build-up layer and on the at least one second intermediate substrate build-up layer.

9. The method of claim 8, wherein substantially simultaneously forming interconnects on the at least one first intermediate substrate build-up layer and the at least one second intermediate substrate build-up layer comprises substantially simultaneously forming solder balls on the at least one first intermediate substrate build-up layer and on the at least one second intermediate substrate build-up layer.

10. A method of fabricating a microelectronic device package, comprising:
    attaching a microelectronic die to a microelectronic device substrate, wherein the microelectronic device substrate is formed by:
    forming a first intermediate substrate including providing a first core having a first surface and an opposing second surface;
        forming at least one conductive trace on the first surface of the first core;
        forming at least one conductive trace on the second surface of the first core;
        forming at least one plated via extending between the at least one conductive trace on the first surface of the first core and the at least one conductive trace on the second surface of the first core; and
        filling the at least one plated via;
    forming a second intermediate substrate including
        providing a second core having a first surface and an opposing second surface;
        forming at least one conductive trace on the first surface of the second core;
        forming at least one conductive trace on the second surface of the second core;
        forming at least one plated via extending between the at least one conductive trace on the first surface of the second core and the at least one conductive trace on the second surface of the second core; and filling the at least one plated via;

then attaching the first intermediate substrate to the second intermediate substrate wherein the first surface of the first intermediate substrate first core faces the first surface of the second intermediate substrate second core;

substantially simultaneously forming at least one build-up layer adjacent the second surface of the first intermediate substrate first core and at least one build-up layer adjacent the second surface of the second intermediate substrate second core; and separating the first intermediate substrate from the second intermediate substrate.

11. The method of claim 10, wherein forming the first intermediate substrate including the first core and forming the second intermediate substrate including the second core comprises forming the first intermediate substrate including the first core having a thickness of less than about 400 µm and forming the second intermediate substrate including the second core having a thickness of less than about 400 µm.

12. The method of claim 10, wherein forming the first intermediate substrate including the first core and forming the second intermediate substrate including the second core comprises forming the first intermediate substrate including the first core having a thickness of less than about 200 µm and forming the second intermediate substrate including the second core having a thickness of less than about 200 µm.

13. The method of claim 10, wherein attaching the first intermediate substrate to the second intermediate substrate comprises disposing an adhesive device between the first intermediate substrate and the second intermediate substrate.

14. The method of claim 13, wherein disposing an adhesive device between the first intermediate substrate and the second intermediate substrate comprises disposing an adhesive material between the first intermediate substrate and the second intermediate substrate.

15. The method of claim 10, wherein attaching the first intermediate substrate to the second intermediate substrate comprises clamping the first intermediate substrate to the second intermediate substrate.

16. The method of claim 15, further comprises placing a protective material between the first intermediate substrate and the second intermediate substrate prior to clamping.

17. The method of claim 10, further comprises substantially simultaneously forming interconnects on the at least one first intermediate substrate build-up layer and on the at least one second intermediate substrate build-up layer.

18. The method of claim 17, wherein substantially simultaneously forming interconnects on the at least one first intermediate substrate build-up layer and the at least one second intermediate substrate build-up layer comprises substantially simultaneously forming solder balls on the at least one first intermediate substrate build-up layer and on the at least one second intermediate substrate build-up layer.

* * * * *